(12) United States Patent
Tzinares et al.

(10) Patent No.: US 6,201,700 B1
(45) Date of Patent: Mar. 13, 2001

(54) BOX DESIGN FOR MAXIMUM HEAT DISSIPATION

(75) Inventors: Alexander Tzinares, Madison Heights; Robert J. McCarthy, Grosse Pointe Woods; Steven L. Wall, Westland, all of MI (US)

(73) Assignee: Ford Motor Company

( * ) Notice: Subject to any disclaimer, the term of this patent is extended or adjusted under 35 U.S.C. 154(b) by 0 days.

(21) Appl. No.: 09/478,573

(22) Filed: Jan. 6, 2000

(51) Int. Cl.$^7$ ........................................... H05K 7/20
(52) U.S. Cl. ..................... 361/719; 361/688; 361/703; 361/704; 361/707; 361/713; 361/720; 361/721; 174/16.3; 174/252; 165/80.3; 165/185
(58) Field of Search .......................... 361/690, 694, 361/695, 704, 707, 709, 705, 706, 715, 716, 721, 784, 790; 174/16.3, 252; 165/80.5, 185

(56) References Cited

U.S. PATENT DOCUMENTS

| | | | | |
|---|---|---|---|---|
| 5,208,733 | * | 5/1993 | Besanger | 361/704 |
| 5,251,099 | * | 10/1993 | Goss et al. | 361/721 |
| 5,309,320 | * | 5/1994 | Smith | 361/704 |
| 5,798,171 | * | 8/1998 | Olson | 428/220 |
| 5,812,374 | * | 9/1998 | Shuff | 361/704 |
| 5,969,953 | * | 10/1999 | Purdom et al. | 361/790 |
| 5,986,887 | * | 11/1999 | Smith et al. | 361/704 |
| 6,014,313 | * | 1/2000 | Hesselbom | 361/704 |
| 6,028,769 | * | 2/2000 | Zurek | 361/704 |
| 6,072,697 | * | 6/2000 | Garcia-Ortiz | 361/704 |

* cited by examiner

Primary Examiner—Leo P. Picard
Assistant Examiner—Boris L. Chervinsky
(74) Attorney, Agent, or Firm—Jennifer M. Stec

(57) ABSTRACT

A system and method for dissipating thermal energy created by multiple electronic circuit boards packaged within a single housing and while in operation are disclosed. The system and method enhances heat convection and heat conduction across and through the housing. A heat conductive housing having a plurality of longitudinally extending fins for increasing the surface area of the housing and correspondingly increasing heat convection to the housing is utilized. Furthermore, the multiple electronic circuit boards are packaged such that a heat conductive path, defined by a thermally conductive material, is disposed between the plurality of electronic circuit boards. Finally, the heat conductive material is applied to the inner surface of the housing and between each of the electronic circuit boards. The present invention increases heat conduction of the thermal energy generated by the plurality of electronic circuit boards to the housing, thereby preventing circuit board damage.

16 Claims, 3 Drawing Sheets

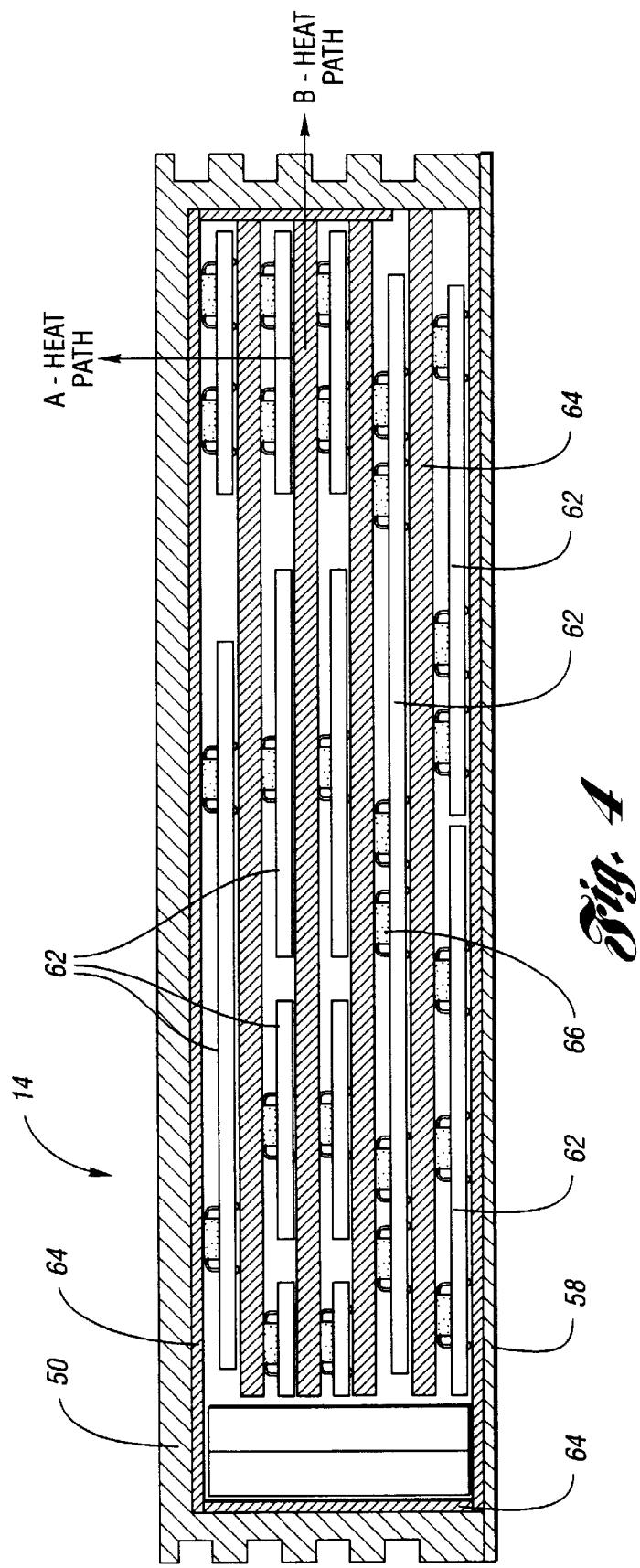

BOX DESIGN FOR MAXIMUM HEAT DISSIPATION

TECHNICAL FIELD

The present invention relates to packaging a plurality of electronic circuit boards within a single housing and including thermal conductive path controls that communicate with external housing fins.

BACKGROUND ART

It has become common practice in the field of electronics to integrate a plurality of electronic circuit boards into one mechanical housing. There are many benefits and advantages gained by integrating a plurality of electronic circuit boards into one housing. For instance, packaging space is increased because fewer modules are needed, the overall weight of the vehicle is reduced, wiring harnesses and connectors are reduced, further reducing costs.

One significant problem associated with integrating the plurality of electronic circuit boards into one housing is the damage that thermal energy (heat) can cause within the housing. Prior art solutions have been to increase the surface area of the housing by the arrangements of heat dissipation fins on the surface of the housing. Generally, heat is dissipated primarily through the operation of heat convection as air moves across and through the heat dissipation fins. However, numerous connectors and components remain subjected to highly heated locations that affect performance, shorten life and reliability of the circuit boards.

Another solution to the thermal energy build-up within the multi-board housing was to add a thermally conductive material between the inside surfaces of the housing arid the top surfaces of the electronic circuit boards which are adjacent the inside surfaces of the housing. Although, this additional conduction path would in some cases act to dissipate some additional thermal energy, this solution has been observed to not provide sufficient heat dissipation for more complex and highly integrated electronic assemblies.

Therefore, a need exists for an improved system and method for dissipating thermal energy created by a super integrated multiple electronic circuit board assembly. The new and improved system and method for dissipating heat must provide sufficient heat dissipation regardless of the complexity and increased integration of the multiple electronic circuit board assembly.

DISCLOSURE OF INVENTION

Accordingly, it is an object of the present invention to provide a system and method for increasing heat dissipation in an electronic module having multiple electronic circuit boards by providing a thermal path between the circuit boards.

In accordance with these and other objects of the present invention a system and method are provided for dissipating thermal energy created by multiple electronic circuit boards packaged within a single housing controlled thermal path between the circuit boards. The method includes utilizing a heat conductive housing with a plurality of external extending fins for increasing the surface area of the housing and correspondingly increasing heat convection from the housing and a heat conductive path is disposed between the plurality of electronic circuit boards for transporting thermal energy to the housing. Finally, the heat path, preferably a layer of conductive material, is applied to the inner surface of the housing and between each of the electronic circuit boards. The present invention increases heat conduction from the components on this plurality of electronic circuit boards to the housing.

In accordance with another aspect of the present invention, a system is provided for dissipating thermal energy created by multiple electronic circuit boards packaged within the single housing. The system includes a heat conductive housing having a plurality of longitudinally extending fins for increasing the surface area of the housing and thereby increasing heat convection across the surface of the housing. A heat conductive material disposed adjacent to an inner surface of the housing and between each electronic circuit board for promoting heat conduction to the housing. The present invention utilizes both heat conduction and heat convection to maximize thermal energy dissipation through the housing to prevent damage or failure of the electronic components packaged within the housing.

The above objects and other objects, features, and advantages for the present invention are readily apparent from the following detailed description of the best mode for carrying out the invention when taken in connection with the accompanying drawings.

BRIEF DESCRIPTION OF DRAWINGS

FIG. 4 is a cross-sectional view through the electronic module illustrating the packaging of the electronic circuit boards and the heat conductive material, according to the present invention.

BEST MODE FOR CARRYING OUT THE INVENTION

Figure 1:
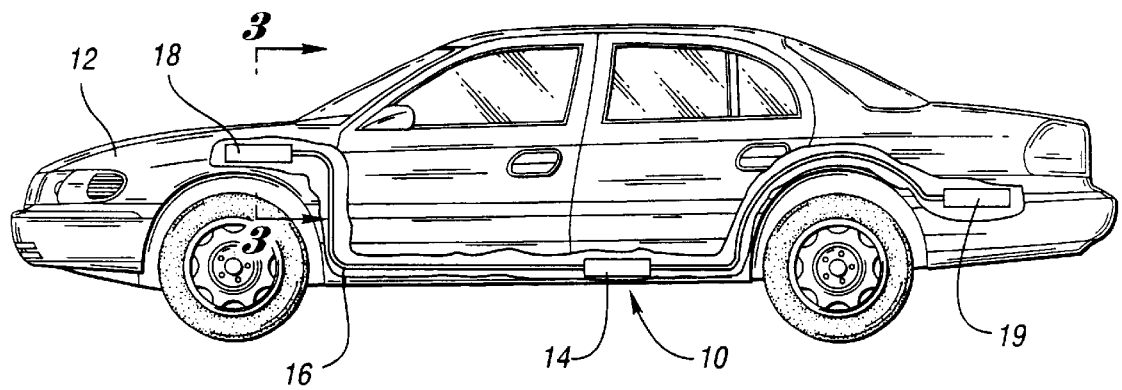
FIG. 1 is a perspective view of a vehicle which includes an electronic control system having electronic modules which are constructed in accordance with the present invention.

With reference to FIG. 1, an electronic control system 10 for use in a vehicle is illustrated. Electronic control system 10 includes a main control unit 14, a front junction box 18, a rear junction box 19, and a communication or local area network 16. Electronic control unit 14, front and rear junction boxes 18 and 19 are highly integrated having multiple circuit boards for controlling a variety of functions and operations of vehicle 12. The vehicle control system 10 is configured for data acquisition and control of vehicle systems including, for example, the engine controls, gearbox, clutch, differential and drive by wire throttle.

The main control unit 14, front junction boxes 18, and rear junction box 19 are connected via a high speed local area network 16. Local area network 16 generally includes two wires for communicating electronic data between the junction boxes and the main control unit. Near real time transfer of control information or data between the junction boxes and the main control unit is accomplished through high speed data transfer, with data transfer rates of up to 8 mega bits per second. Local area network 16 can support several junction boxes 18 and 19 resulting in significant reduction in wire harness complexity and weight as compared to other systems having configurations where sensors and actuators are connected directly to a central control unit.

Figure 2:
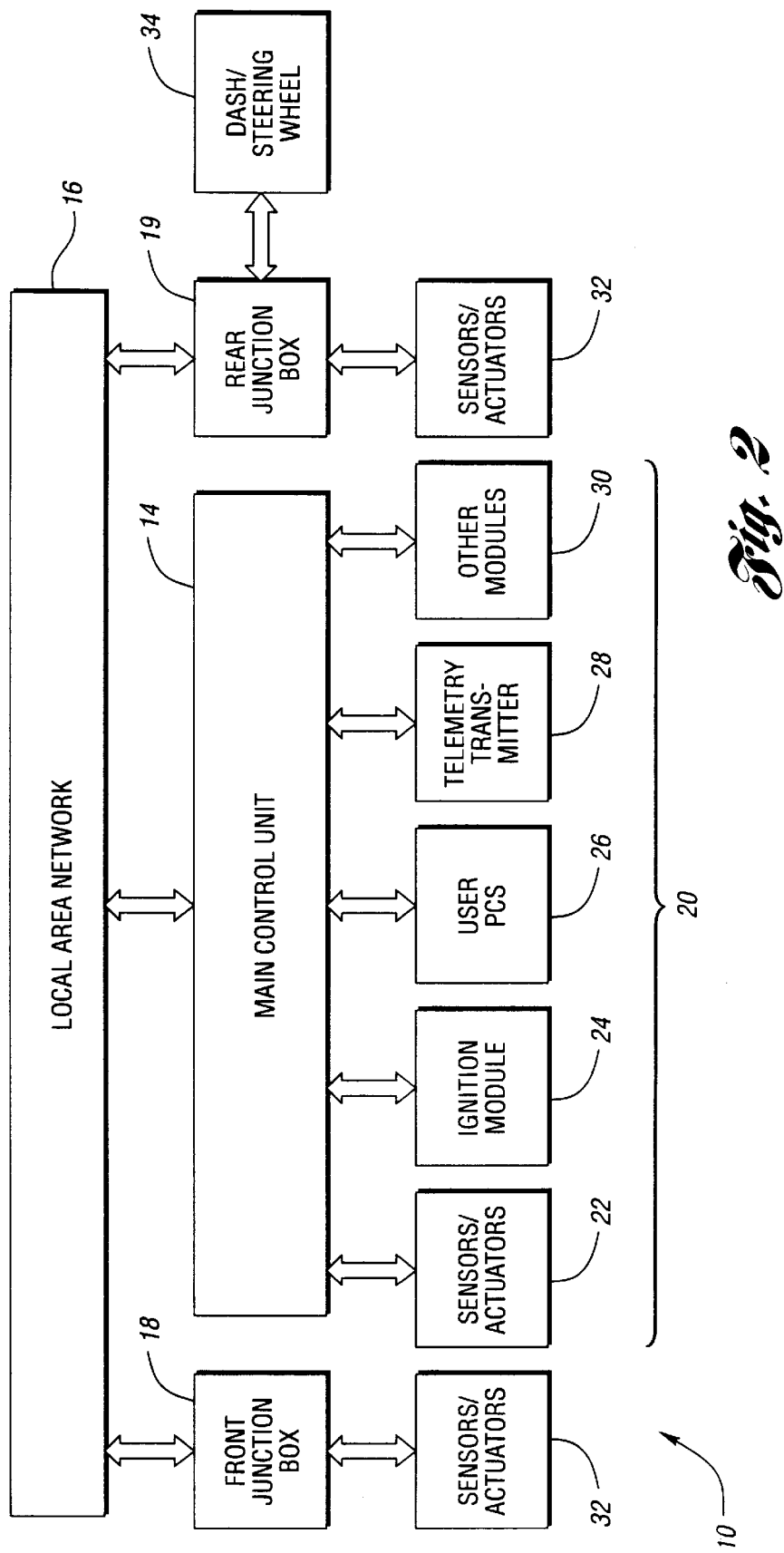
FIG. 2 is a block diagram of an electronic control system which may utilize the present invention.

FIG. 2 is a block diagram illustrating an electronic control system 10 which may utilize the system and method of the present invention. A vehicle control system 10 as shown in further detail in FIG. 2 includes the main control unit 14 having a plurality of interfacing modules and sensors 20 for controlling and measuring specific vehicle components and systems. For example, sensors and actuators 22 are in communication with the control unit 14 for measuring, monitoring, and manipulating various vehicle components for maintaining and improving vehicle operation and control.

An ignition module 24 is interfaced with the main control unit 14 for, generally, controlling the ignition system of the vehicle. A user PCS module 26 is also in communication with main control module 14 for communicating user preferences to the main control unit for modifying control and operation of vehicle 12 per user defined inputs. A telemetry transmitter module 28 is utilized by control system 10 for transmitting vehicle operating data such as engine temperature, engine speed, and the like to other control modules within vehicle 16 which require such data. Of course, other modules 30 may be interfaced with main control unit 14 as required for improving vehicle operation and control.

Vehicle control system 10 further includes front and rear junction boxes 18 and 19 having sensors and actuators 32 in communication thereto. Sensors and actuators 32, for example, may perform the functions of measuring system operation, and implementing control techniques communicated to the junction boxes via the local area network 16 by the main control unit 14. A dash and steering wheel control module 34 is shown in communication with the rear junction box 19 for receiving and sending vehicle operation and control information to the main control unit 14 via the local area network 16.

Figure 3:
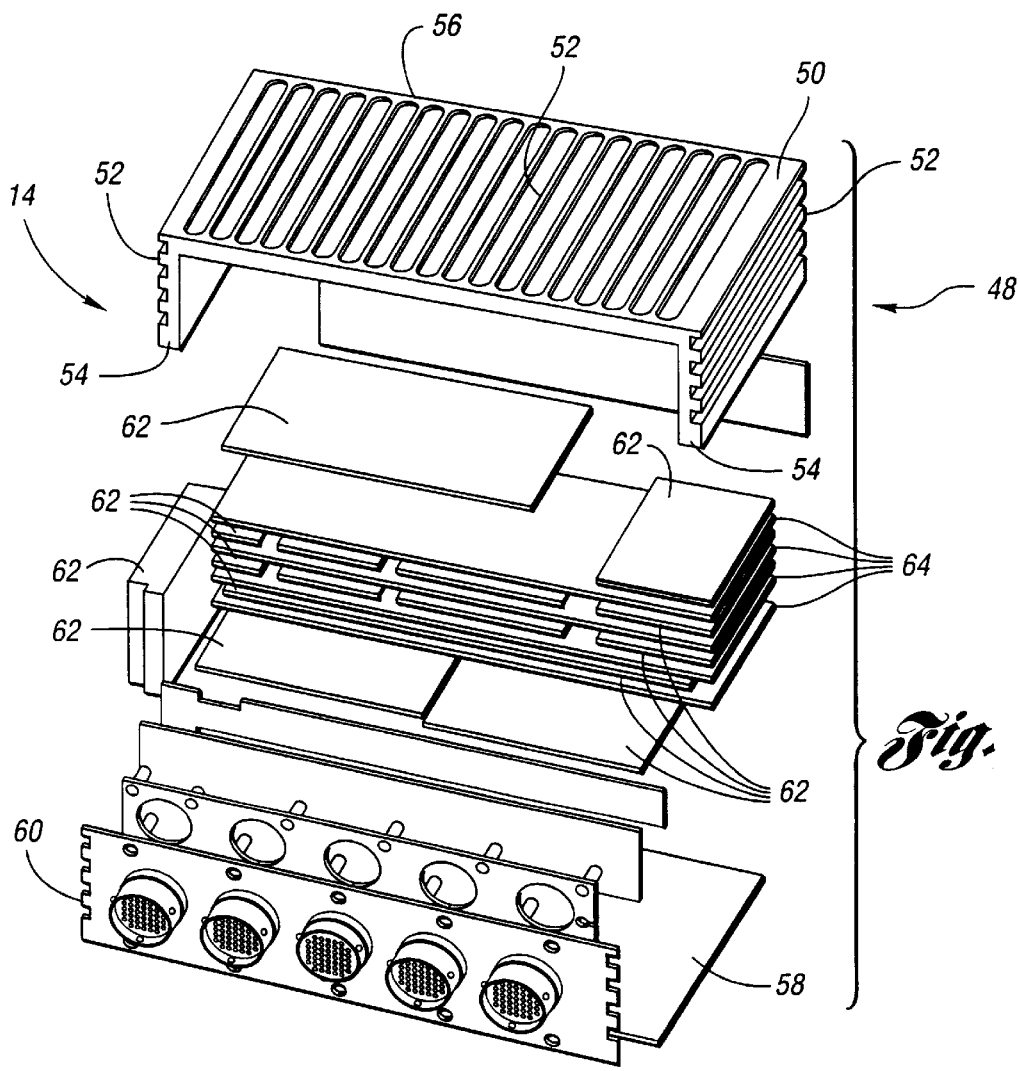
FIG. 3 is an exploded view of the electronic module constructed in accordance with the present invention.

Referring now to FIG. 3, an exploded view illustrating the internal components of a typical main control unit 14 is shown, according to the present invention. Main control unit 14 includes a housing 48 having a top cover 50, the top cover 50 has a series of longitudinally extending heat dissipation fins 52 for increasing the surface area of the top cover 50. The increased surface area of the top cover 50 correspondingly increases thermal energy dissipation by the operation of heat convection through the top cover. Top cover 50 also includes integrally connected and downwardly depending sidewalls 54 and a rear wall 56. A bottom plate 58 and a connector plate 60 are connected to the top cover 50 using conventional fasteners for enclosing the contents of the main control unit 14.

With continuing reference to FIG. 3, a plurality of electronic circuit boards are shown, in accordance with the present invention. A plurality of electronic circuit boards 62 are packaged vertically adjacent to one another as well as side by side. The circuit boards perform a variety of functions related to control, measurement, monitoring and operation of vehicle 12. For example, electronic circuit boards which may be included in the main control unit 14 include torque sensing boards, memory cards, power supplies, an injector module, analog inputs, electronic control unit interfaces, electronic control unit controllers and high speed logger, power input/output cards, general purpose logger, analog and digital interface cards, and a connector interface card.

Each of the electronic control boards described above generates significant thermal energy that must be dissipated to prevent damage to the boards and to electronic devices mounted thereon. Specifically, substantial heat is generated by the power supply module, the high speed microprocessors, the output drivers, and the injector module. The tight packaging of main control unit 14 is carefully controlled to optimize thermal management and in order to meet the operating temperature thresholds of the electronic componentry mounted on the electronic boards. For example, electronic components such as a Motorola 509 power PC chip and digital signal processors which are 32 bit chips running at 24 mega hertz and 33 mega hertz, respectively, and perform up to a hundred million floating point operations per second generate a substantial amount of thermal energy. The clock speeds on these imbedded microprocessors are selected to guarantee robust operation under extreme temperature conditions. However, their operation will be degraded if the thermal energy build-up within the main control unit housing is not dissipated.

Thermal energy dissipation is accomplished through the use of thermally conductive sheet material 64 in accordance with the present invention. Aluminum oxide suspended in a silicon base is one type of thermally conductive sheet material that may be used. Of course, other thermally conductive and non-electrically conductive sheet material may be used as required.

The thermally conductive material is disposed over the interior surfaces of the housing, and more specifically, over the interior side wall surfaces, interior top cover surface, interior rear wall surface, and interior bottom plate surface. Preferably, thermally conductive material having an adhesive layer is used to secure the thermally conductive material to the desired surfaces. Thermally conductive material 64 is also disposed between each vertically adjacent circuit board, as shown in FIGS. 3 and 4.

Referring now to FIG. 4, a cross-sectional view of the main control unit 14 is illustrated, according to the present invention. As shown, thermally conductive material 64 is positioned to create a thermal conductive path to the module housing. As indicated by arrows A and B, at least two thermal conductive paths are created by the placement of thermal conductive material 64 between the electronic circuit boards and over the interior surfaces of the module housing. As shown in FIG. 4, electronic components or devices 66 which create thermal energy are sandwiched between at least two pieces of thermally conductive material 64. Thermal energy or heat is drawn through the heat conductive material and electronic components along path "A" to top cover 50 where heat convection operates to dissipate the thermal energy. Similarly, heat is conducted outwardly along path "B" through adjacent thermally conductive material and through the side walls of the top cover 50.

In an embodiment of the present invention thermally conductive material 64 extends to a layer of thermally conductive material which is attached to the inside walls of the top cover 50. Alternatively, the thermally conductive material 64 may extend to the inside wall of the top cover which is not covered by a layer of thermally conductive material, as shown in FIG. 4. Other variations in placement of the thermally conductive material 64, not disclosed herein, will be obvious to individuals skilled in the art.

The advantages and benefits of the present invention are many. For example, the present invention allows super integration of complex, multiple circuit board control units. Such super integrated control units are capable of running multiple control systems including engine, gearbox, clutch, differential and drive by wire throttle.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for dissipating thermal energy created by multiple electronic circuit boards packaged within a single housing and while in operation, the method comprising:

constructing a heat conductive housing with a plurality of external fins for increasing a surface area of the housing and correspondingly increasing heat convection across the surface area;

packaging the multiple electronic circuit boards such that a controlled path defined by a thermally conductive material layer may be disposed between the plurality of electronic circuit boards;

applying a thermally conductive, non-electrically conductive material layer between each of the plurality of electronic circuit boards, and positioning said material layer as a conductive path to the housing, thereby increasing heat conduction from the plurality of electronic circuit boards to the housing.

2. The method of claim 1, wherein the thermally conductive material is aluminum oxide suspended in a silicon base.

3. The method of claim 1 wherein said positioning comprises applying the thermally conductive material layer to an inner surface of the housing.

4. The method of claim 1, wherein applying the thermally conductive material further comprises adhering said thermally conductive material layer using an adhesive to the plurality of electronic circuit boards.

5. The method of claim 1 further comprising moving a gas across the surface area of the housing for increasing heat dissipation through the housing.

6. The method of claim 1 wherein the external fins extend along the housing for increasing heat dissipation through the housing.

7. A system for dissipating thermal energy created by multiple electronic circuit boards packaged within a single housing while in operation, the system comprising:

a top cover having a pair of downwardly depending side walls and a plurality of heat dissipation fins integrally formed therein;

a plurality of vertically spaced electronic circuit boards having electronic devices operatively disposed thereon; and a thermally conductive path defined by a thermally conductive material layer disposed between each vertically spaced electronic circuit board, and a thermally conductive path defined by a thermally conductive material layer disposed between the plurality of circuit boards and an inside surface of the top cover.

8. The system of claim 7, wherein the thermally conductive material is secured to an inner surface of the housing.

9. The system of claim 7, wherein the thermally conductive material is aluminum oxide suspended in a silicon base.

10. The system of claim 7, wherein the thermally conductive material has an adhesive disposed on a surface of the thermally conductive material for attaching the thermally conductive material to the inner surface of the housing and to the plurality of electronic circuit boards.

11. The system of claim 7 wherein the fins extend along the housing for increasing heat dissipation across the housing.

12. An electronic control module having a plurality of electronic circuit boards for controlling a vehicle operation, the electronic control module comprising:

a housing having a top cover, a front plate and a bottom plate, the top cover includes a plurality of heat dissipation fins for increasing the surface area of the top cover to increase heat convection across a surface of the top cover; and a thermally conductive path defined by a thermally conductive material layer disposed on an inside surface of the housing and a thermally conductive path defined by a thermally conductive material layer disposed between each adjacent pair of electronic circuit boards.

13. The module of claim 12, wherein the thermally conductive material is secured to an inner surface of the housing.

14. The module of claim 12, wherein the thermally conductive material is aluminum oxide suspended in a silicon base.

15. The module of claim 12, wherein the thermally conductive material has an adhesive disposed on a surface of the thermally conductive material layer for attaching the thermally conductive material to the inside surface of the housing and to the plurality of electronic circuit boards.

16. The module of claim 12 wherein the fins extend along the housing for increasing heat dissipation through the housing.

* * * * *